United States Patent [19]

Sadlo et al.

[11] Patent Number: 4,554,732
[45] Date of Patent: Nov. 26, 1985

[54] HIGH RELIABILITY ELECTRICAL COMPONENTS

[75] Inventors: James L. Sadlo, Oakdale; Gary D. Musil, Minneapolis, both of Minn.

[73] Assignee: General Electric Company, Schenectady, N.Y.

[21] Appl. No.: 617,056

[22] Filed: Aug. 1, 1984

Related U.S. Application Data

[62] Division of Ser. No. 349,080, Feb. 16, 1982, Pat. No. 4,486,738.

[51] Int. Cl.$^4$ ............................................. H01C 17/06
[52] U.S. Cl. ........................................ 29/620; 29/621; 427/96; 427/97; 427/102; 427/103
[58] Field of Search .................... 29/620, 621; 427/96, 427/97, 102, 103

[56] References Cited

U.S. PATENT DOCUMENTS

| | | | |
|---|---|---|---|
| 4,199,745 | 4/1980 | Barry | 338/320 |
| 4,278,706 | 7/1981 | Barry | 427/96 |
| 4,294,648 | 10/1981 | Brede | 156/627 |

Primary Examiner—John D. Smith
Attorney, Agent, or Firm—J. F. McDevitt; Philip L. Schlamp; Fred Jacob

[57] ABSTRACT

An array of electrically interconnected spaced electrical components on an apertured substrate wafer, each component being connected to terminal conductor pads on one surface of the substrate and to terminal conductor pads on the opposite surface of the substrate by thick film conductor strips which extend along the walls of the apertures is disclosed.

4 Claims, 4 Drawing Figures

HIGH RELIABILITY ELECTRICAL COMPONENTS

This is a division of application Ser. No. 349,080, filed Feb. 16, 1982, now U.S. Pat. No. 4,486,738.

The present invention relates to an array of electrically interconnected high reliability electrical circuit components which can be separated into individual components, particularly discrete resistors, and to a method for fabrication of such an array of components.

In today's mass electronic components market, there is a growing demand for reliable electrical circuit components which can be adapted to automated mass production techniques. It has been reported that automated handling equipment and electrical circuit components are being developed to meet such needs. *Electronics*, Nov. 17, 1981, page 90 et seq.

Among the known components are those disclosed in, for example, U.S. Pat. Nos. 4,199,745 and 4,278,706 which relate to a matrix of discrete spaced electrical components in fixed array on a substrate wafer, each component being connected to terminal conductor pads on the opposite surface of the substrate by thick film conductor strips that extend along the walls of slotted apertures in the wafer.

Another form of discrete resistor is described in *Electronics*, supra, where chip resistors are built on high-purity alumina substrates by screening on resistive paste, laser-trimming to the required value, applying wraparound edge terminals and depositing a glass passivation layer thereover to complete the sealed, leadless assembly.

Individual resistors are also made by a technique involving dipping each end of a device into a thick film conductor paste followed by a sintering step to fix the conductors to the substrate by conventional thick film drying and firing procedures A resistor thick film paste is then screen printed on the substrate and fired in the conventional manner.

The arrays of electrical circuit components produced in accordance with the present invention provide discrete components which are economically produced in a wide range of resistance values and tolerances. The discrete resistors produced in accordance with the invention may have dimensional compatibility for microstrip and stripline applications which utilize components 50 mils (1.27 mm) in width, 75 mils (1.91 mm) in length and 20 mils (0.51 mm) in depth with wraparound terminations. Such components offer physical and thermal ruggedness as well as significant attachment simplifications.

Another feature of the invention is an electrical component fabrication process comprising the steps of depositing electrically conductive material on one surface of a substrate of electrically insulating material utilizing thick film techniques and drawing deposited material along selected edges of the substrate towards the opposite surface, firing the deposited film to make it conductive and repeating the process on the other surface. In particular embodiments, the substrate is provided with apertures and discrete component elements on one surface of the substrate which are electrically interconnected to terminal pads on said one surface and to terminal pads on the opposite surface of the substrate by a conductive layer lining the aperture walls.

The resulting article is an array of spaced electrical components (which may be individual components or networks) in fixed array on an apertured substrate wafer, each component being connected to terminal conductor pads on one substrate wafer surface and to terminal pads on the opposite surface of the substrate by thick film conductor strips which extend along the walls of the apertures. This array of electronic components features handling convenience, including trimming of resistor portions, measuring of the components by scanning the entire wafer using a probe card technique, and storing component data in a computer memory for inventory control. The wafer array of components can be conveniently stored in inventory. When required for use, the component terminals may be tinned while the components are still in wafer array form and diced by, for example, conventional lasering techniques into the desired chip geometries. The resulting individual components have wraparound terminations which facilitate circuit attachment.

The objects and advantages of the present invention will become apparent from the following detailed description and the accompanying drawings in which.

DETAILED DESCRIPTION OF THE INVENTION

Figure 1:
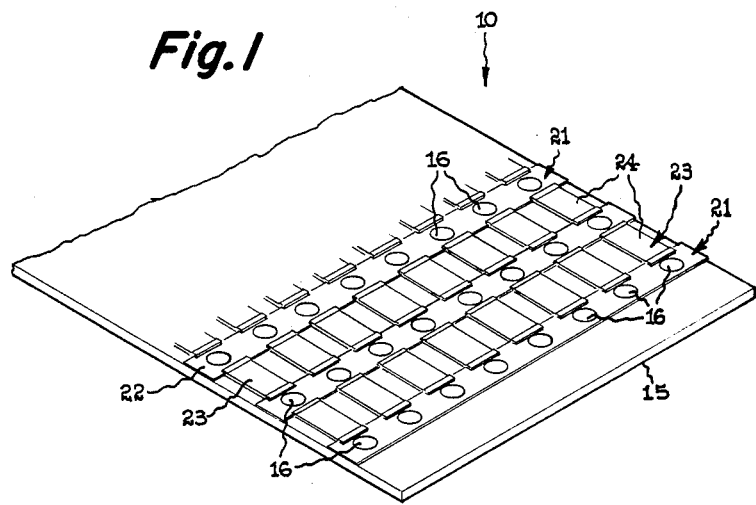
FIG. 1 is a diagrammatic perspective view of an array of resistor components of the present invention.

Referring now to the drawings, array 10 comprises substrate 15 of a ceramic or other insulating material or a conductive material with an insulating covering layer such as a porcelain on steel substrate.

Substrate 15 is typically a high alumina ceramic material such as AlSiMag Brand 614 alumina ceramic containing 96% $Al_2O_3$ in a commonly processed substrate size such as 2 inches×2 inches×0.025 inch or 3 inches×3 inches×0.025 inch.

Figure 3A:
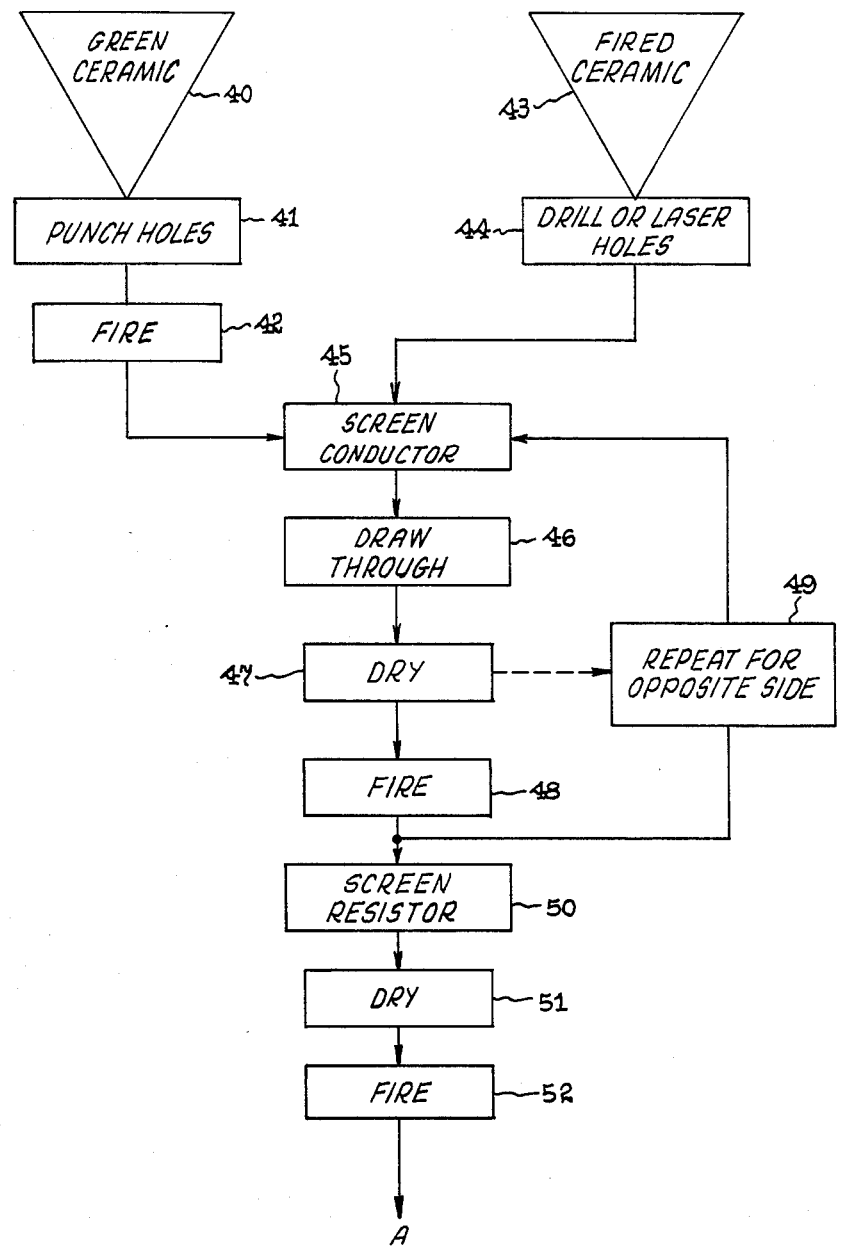
FIGS. 3A and 3B show a flow chart of the process of the present invention.
Figure 3B:
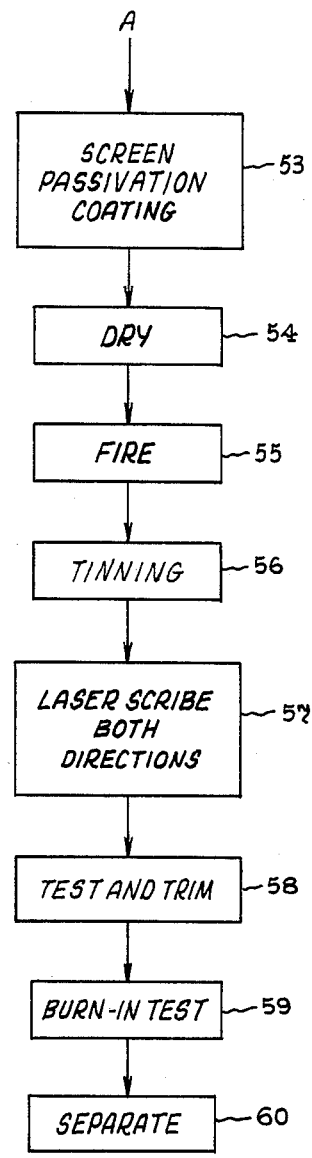

Alumina substrate 15 in a green (unfired) state, shown in block 40 of FIG. 3, is provided with a series of apertures 16 by punching or drilling in the conventional manner as indicated by block 41. The thus apertured green ceramic is then fired at a temperature of 1670° C. for 2 hours soak in a tunnel kiln (block 42). When substrate 15 is in the form of a fired ceramic or other insulating material (block 43), it is mechanically drilled or laser bored to provide the pattern of apertures 16 therein (block 44).

The pattern of apertures 16 in substrate 15 is, of course, dependent on the size of the individual discrete electrical components in array 10. For discrete resistors 20 having dimensions of 50 mils (1.27 mm) in width and 75 mils (1.91 mm) in length, apertures 16 nominally measuring 20 mils (0.51 mm) in diameter are spaced 50 mils (1.27 mm) from each other in each row, each parallel row of apertures being spaced 75 mils (1.91 mm) from each other. Although apertures 16 have been described as circular apertures nominally measuring 20 mils (0.51 mm) in diameter, apertures 16 are actually 20 mils (0.51 mm)×25 mils (0.635 mm) rectangles with very large radiused corners thus making apertures 16 appear to be circular. It will be immediately apparent that apertures 16 could take other forms than the circular or rectangular shapes described. For other component sizes, the apertures would be correspondingly spaced.

Apertured substrate 15 is then placed onto a porous but rigid substrate holder (not shown) of a conventional thick film printer such as a Universal Model 1202 printer or an ETP Model L-200 printer. The substrate holder is fabricated from material such as an open-celled lava rock Another useful holder is one molded from a glass bead composite material such as 3M brand Tegra glass beads.

A thick film conductor ink pattern 21 is then screen printed onto the surface of the substrate 15 (block 45) using a conductive ink available from Thick Film Systems, Inc. under the trade designation Multifire 3428 Pd-Ag. Another suitable conductive ink is available from E. I. Du Pont under the trade designation Copper 9922. The conductive ink pattern 21 consists of parallel stripes 22 of ink extending over the parallel rows of apertures 16 in substrate 15, with the apertures 16 centered within the stripe. Vacuum supplied by the printer serves to draw conductor ink down along the walls of apertures 16 to a depth of approximately two-thirds the thickness of the substrate 15 (block 46). The substrate 15 is then removed from the holder and the conductor ink is dried (block 47) by placing in an oven or by placing in a belt dryer such as a Browne Model LR-6 Reflow Dryer available from Browne, Inc. After drying, the substrate 15 is fired in a kiln (block 48) capable of sintering the ink and rendering it conductive. One such kiln is a 5-zone multiatmosphere 4-inch belt 1100° C. kiln available from BTU Engineering Corp., Bruce Systems. The printing, drawing, drying and firing steps are then repeated (block 49) on the opposite surface of the substrate 15. It will be apparent that a single firing step may be utilized although in so doing, special kiln furniture may be required.

Once both surfaces of substrate 15 are printed and fired with the conductor ink pattern 21, a pattern 23 consisting of, for example, resistor elements in the form of transverse bars 24 extending between and electrically interconnected to the parallel stripes 22 of ink pattern 21, is applied on one surface of substrate 15 (block 50) in the manner and with the equipment described for applying ink pattern 21.

Referring to FIG. 1, it will be seen that the transverse bars 24 of pattern 23 are positioned such that each bar 24 is in alignment with and extends between a pair of apertures 16 and slightly overlaps stripes 22 at each end.

Thick film resistor inks or pastes are available in a wide variety of resistive values. Representative examples of such inks or pastes are the Powerohm 850 series available from Thick Film Systems, Inc., the Series 17 and 4238 Copper Compatible Resistor System available from E. I. Du Pont and the 5000 Series Resistor Inks available from Electro Materials Corp. of America.

The resistor ink pattern 23 on substrate 15 is then subjected to the drying (block 51) and firing (block 52) steps in the same manner as for pattern 21.

The substrate 15 can then be screen printed with a passivating thick film material (block 53) such as that available under the trade designation Silica-Seal Dielectric 1141 R.C.G. from Thick Film Systems, Inc. The passivating layer is dried or glazed (block 54) and fired (block 55) according to the manufacturer's instructions usually in the type of equipment utilized for drying and firing the ink patterns 21 and 23.

The resulting array 10 can now have the conductor areas or parallel stripes 22 tinned (block 56) by one of several conventional means such as screen printing and vapor phase reflow or pneumatic injection of tinning paste onto the conductor area and reflowing on a conveyer belt heater. After this tinning step, the substrate 15 is scribed by a laser on both sides in both the X and Y direction (block 57). In the X direction, the laser scribing would be along a line parallel to the transverse bars 24 and midway between the bars 24. In the Y direction, the laser scribing would be along a line bisecting apertures 16. The scribing operation having isolated the components from parallel electrical interconnection but still keeping said components connected in series, allows the individual devices in array 10 to be measured individually and adjusted to desired values (block 58).

The completed array 10 on substrate 15 can now be tested (block 59) in a manner which will predict usefulness in the intended environment. This may involve what is known as "burn-in" testing which is the actual measurement of the device under a load comparable to its actual use load. Finally, the array is separated into individual components by lasering, snapping or sawing (block 60).

An outstanding advantage realized with the arrays of the present invention is that it is possible to provide resistors over a wide range of resistance values with a minimum number of arrays. Thus, depending on the percent of resistor trim allowed, usually 50 to 60%, sixteen to twenty-one different as-fired resistor value arrays can adequately cover a resistor value range from 4 ohms to 8 megohms. Individual resistors in this range of resistance values can be made available with very short lead times since the desired resistor would be produced from the closest as-fired resistor value array by trimming the resistor bar 24 to the desired value by laser cutting or abrading.

Figure 2:
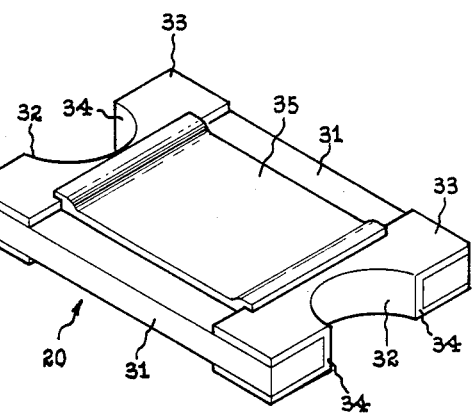
FIG. 2 is a diagrammatic perspective view of a discrete resistor after dicing from the array of FIG. 1.

Upon separation, the resulting discrete resistor 20 shown in FIG. 2 is seen to comprise an insulating body member 31 of a ceramic or other insulating material, said body member 31 being provided with a central notch 32 along two opposed edges, terminal pads 33 on the top and bottom surfaces of said body member 31 along the opposed notched edges, terminal pads 33 on the top and bottom surfaces along each edge being electrically interconnected to each other by conductor strip 34 lining the wall of notch 32 and resistor element 35 on the top surface of body member 31 electrically interconnected to terminal pads 33 and slightly overlapping said terminal pads 33 at each end.

It will be readily apparent that various modifications of the invention are possible. For example, pattern 21 may consist of spaced square dots of conductive ink superposed over apertures 16 rather than the parallel stripes 22 illustrated in FIG. 1. This and other variations will suggest themselves to those skilled in the art.

We claim:

1. A process for fabricating an array of electrically interconnected spaced electrical circuit components which are separated to form a plurality of individual discrete resistors comprising the steps of forming a series of through apertures in a substrate of electrically insulating material and aligned in at least two parallel rows, both said rows and apertures in each row being spaced apart from each other, depositing thick film paste electrical conductor material as a continuous strip on one surface of said substrate to form at least two parallel rows of spaced apart conductor portions surrounding each aperture and serving as terminal conductor pads for an individual resistor, applying a pressure differential across said substrate to draw said deposited conductor material along walls of said apertures to form connector portions extending toward the opposite surface of the substrate, depositing further thick film paste electrical conductor material as a continuous strip on the opposite surface of said substrate to form at least two parallel rows of spaced apart conductor portions surrounding each aperture on said opposite substrate surface corresponding to said spaced conductor portions on said one substrate surface and also serving as further terminal conductor pads for an individual resistor and then applying a pressure differential across said substrate to draw said further conductor material along walls of said apertures towards said one substrate surface to form connector strips electrically connecting corresponding conductor portions, depositing thick film resistor material on one substrate surface to form a pattern of spaced bars between adjoining pairs of said spaced conductor portions aligned in a transverse row and electrically interconnected thereto, and dicing said substrate by scribing a line between and parallel to said spaced resistor bars in one direction and bisecting said conductor portions in the other direction to provide said plurality of individual discrete resistors.

2. A process as in claim 1 wherein the electrical conductor material is deposited by screen printing.

3. A process as in claim 1 wherein the electrical conductor material and the resistor material are both deposited by screen printing.

4. A process as in claim 1 which further include depositing a passivating thick film material on the substrate after depositing of the resistor material.

* * * * *